United States Patent [19]
Hutchison et al.

[11] 4,115,836
[45] Sep. 19, 1978

[54] COOLING SYSTEM FOR DUAL-IN-LINE PACKAGES

[75] Inventors: Robert V. Hutchison, Oceanside; Peter P. Gregg, Vista; James J. MacBride, Carlsbad, all of Calif.

[73] Assignee: Burroughs Corporation, Detroit, Mich.

[21] Appl. No.: 790,291

[22] Filed: Apr. 25, 1977

[51] Int. Cl.² .............................................. H05K 7/20
[52] U.S. Cl. .................................. 361/382; 361/385; 361/386; 339/17 F
[58] Field of Search ............... 361/385, 386, 398, 413, 361/381, 382, 415; 357/82; 174/52 FP; 339/17 F, 17 M, 17 CF, 17 LM

[56] References Cited
U.S. PATENT DOCUMENTS

| | | | |
|---|---|---|---|
| 3,719,860 | 3/1973 | Lawrence | 174/52 FP |
| 3,727,168 | 4/1973 | Henschen | 361/398 |
| 3,946,276 | 3/1976 | Braun | 361/385 |
| 3,999,826 | 12/1976 | Yurtin | 339/17 F |
| 4,026,011 | 5/1977 | Walton | 361/398 |

Primary Examiner—Gerald P. Tolin
Attorney, Agent, or Firm—Joseph R. Dwyer; Mervin L. Young; Kevin R. Peterson

[57] ABSTRACT

A cooling system for integrated circuit packaging of the conventional dual-in-line (DIP) type including a carrier heat sink plate which form web sections which engage the bodies of the DIP held side-by-side thereon. The plate is thermally and mechanically connected by means of a clamping device to a cooling frame in which a serpentine tubing carries coolant throughout spaced apart sections thereof, so that the heat generated by the DIP's is carried away by the heat sink plate into the frame sections where the coolant circulate. The DIP pins are electrically connected to a printed circuit board and to relatively flat flexible ribbon type printed circuit type cable the latter being clamped at each end into a standard connector which itself is clamped to an island printed circuit board having conductors thereon for connecting the DIP's to other electronic devices. Multiplicity of these DIP's so mounted in the cooling frame may be housed in the same console or housing along with other DIP islands as desired.

11 Claims, 5 Drawing Figures

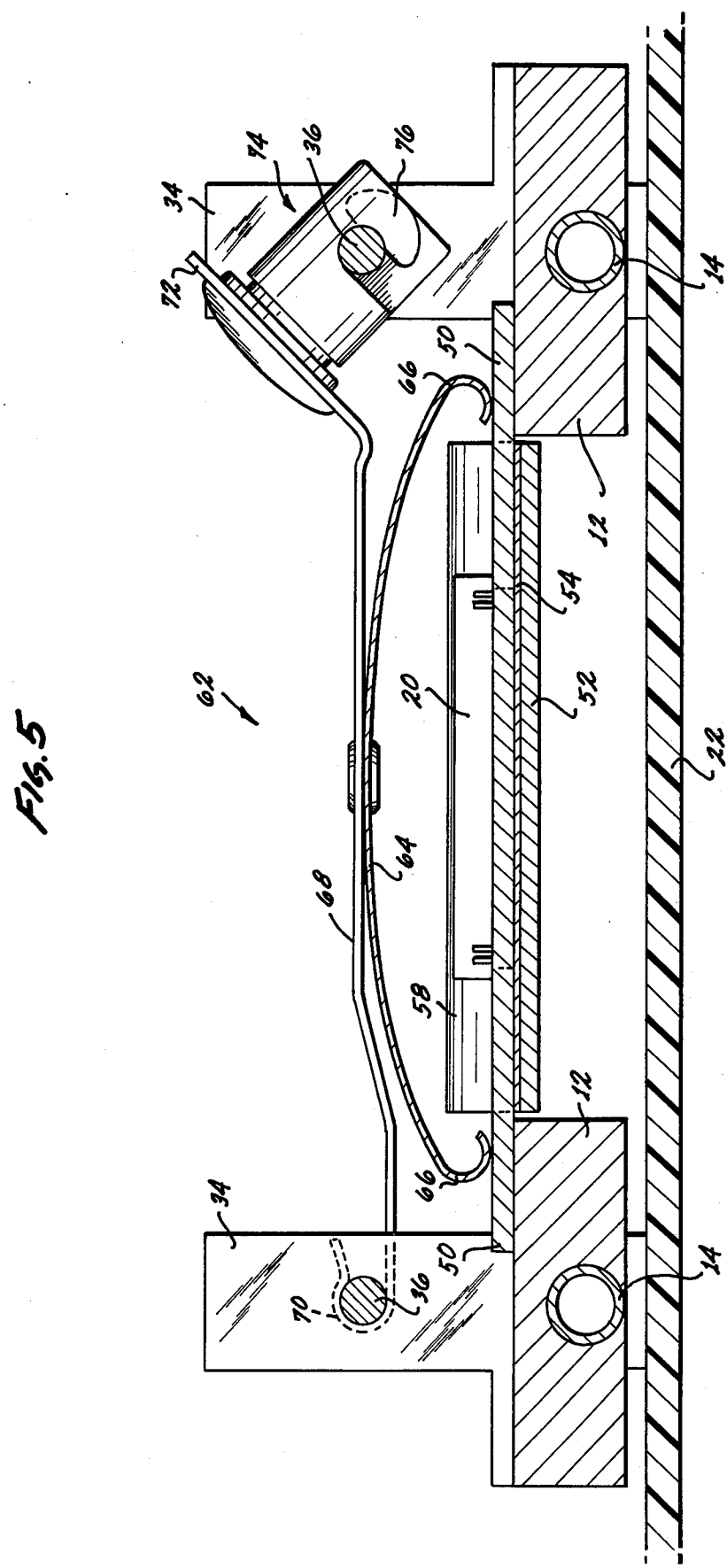

COOLING SYSTEM FOR DUAL-IN-LINE PACKAGES

BACKGROUND OF THE INVENTION

In the U.S. Pat. No. 3,946,276 to Braun et al, entitled "Island Assembly Employing Cooling Means for High Density Integrated Circuit Packaging" dated Mar. 23, 1976, it was shown that to maximize the operation of high density integrated circuits for high speed computer systems, an efficient cooling means was required to secure thermal impedance control. The packaging system disclosed and claimed therein was oriented toward high quality production and assembly to achieve minimum costs and, as shown, included at least one island which comprise an assembly of a plurality of integrated circuit packages of the leadless type, connectors for receiving the packages, and interpackage connection medium and a cooling frame. The island cooling frame supported the assembly and further incorporated a continuous tubing arranged in a serpentine path through which a liquid coolant was pumped to carry away the heat generated by the integrated circuit packages.

This heat transfer was accomplished efficiently by permitting metal heat sink plates formed as an integral part of the integrated circuit packages to contact the cooling frame sections so that the circulating coolant maintained the island at a substantially uniform temperature. The patent also taught the manner in which a plurality of such islands may be interconnected through the use of ribbon type interconnect cables having terminal boards at each end which were adapted to plug into similar connectors and further that several islands could be housed in a console.

To improve, however, the operability and the adaptability of the island assembly to which the aforesaid patented invention pertains, it has been found desirable to provide for interconnection of the patented system to other systems and to other devices, such as I/O terminals, manufactured by the assignee of this invention or by others, to combine the patented system with other types of integrated circuit packages manufactured by this assignee or by others and to mound them in an identical cooling frame so as to be housed in the same or a similar sized console and to subject these packages to the same or similar circulating coolant. It, of course, was found to be desirable to do this without any modification to the existing cooling frame and to use as much of the existing hardware such as the connectors for receiving the prior art leadless type integrated circuit packages and the clamping means for clamping these packages into the connectors, so as to lessen the cost and yet maintain the high quality production and assembly processes to which the patented invention was oriented.

SUMMARY OF THE INVENTION

The system which meets the foregoing desirable goals comprises a relatively flat, substantially rectangular, carrier heat sink plate having apertures therein to form DIP supporting web sections which engage the bodies of the DIP's held side-by-side thereon and whose pins extend through the apertures into a relatively flat flexible ribbon type printed circuit type cable and a secondary interconnection means; the ends of said cable extending beyond ends of said carrier heat sink plate and clamped into a conventional connector which in turn is electrically connected to an island interconnection medium. The carrier heat sink plate engages a cooling frame in which a serpentine tubing carries coolant throughout spaced apart sections thereof so that the heat generated by the DIP's is carried away through the heat sink plate into the cooling frame. The utilization of the ribbon type carrier permits the use of the conventional connectors and a standard cooling frame without modification so that the DIP's can be utilized in the existing hardware. The DIP's can be connected to one another and to other integrated circuit packages on the same island or other islands and a multiplicity of these DIP's so mounted in the cooling frame may be housed in the same console or housing along with other DIP islands or other islands containing integrated circuit packages of the type described and claimed in the foregoing Braun et al patent.

BRIEF DESCRIPTION OF THE DRAWINGS

FIG. 5 is an elevational view enlarged to show the details of the clamp and assembly.

DESCRIPTION OF THE PREFERRED EMBODIMENT

Figure 1:
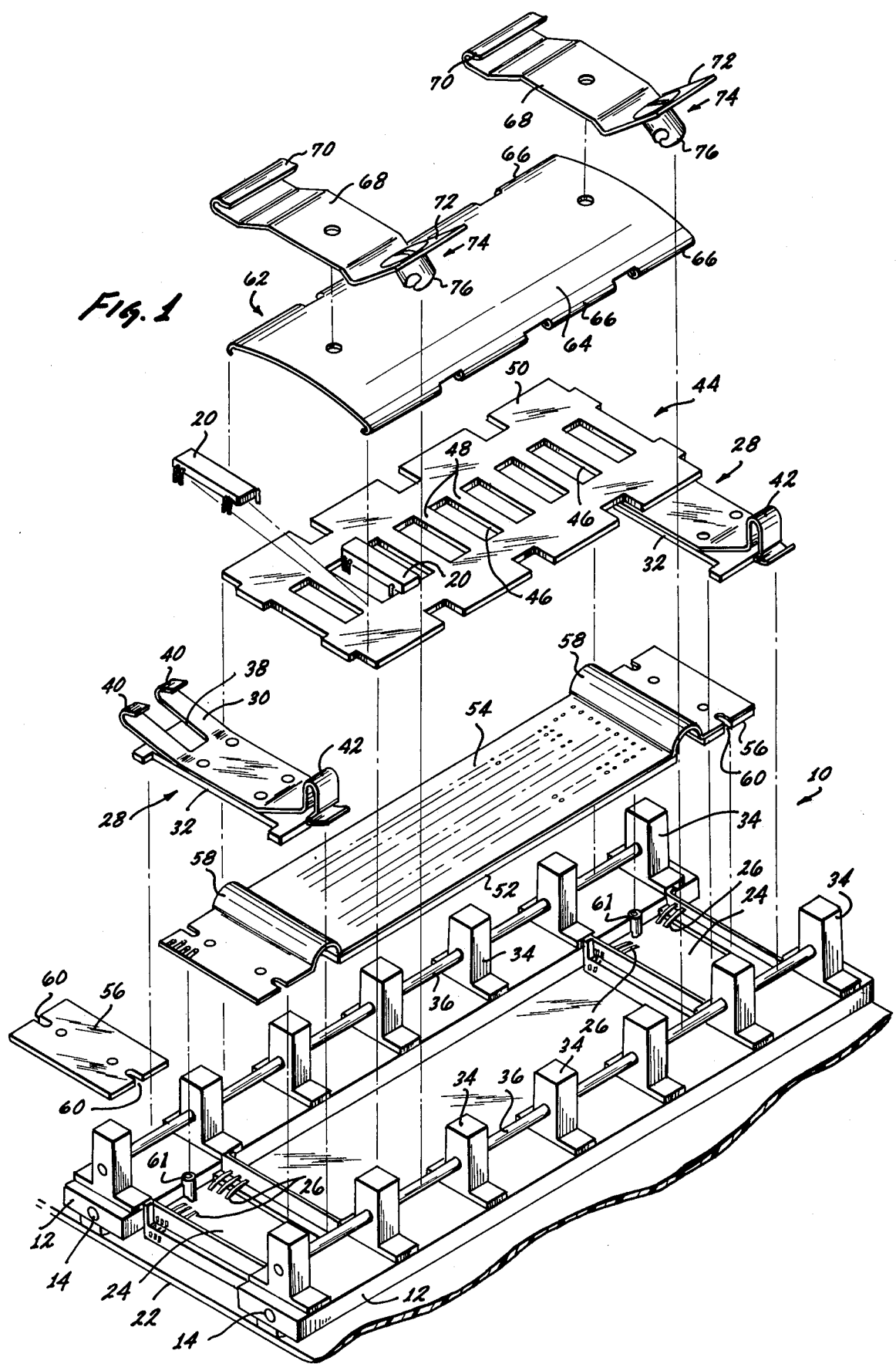
FIG. 1 is a perspective and exploded view of the invention to illustrate more clearly the various components of the assembly.
Figure 2:
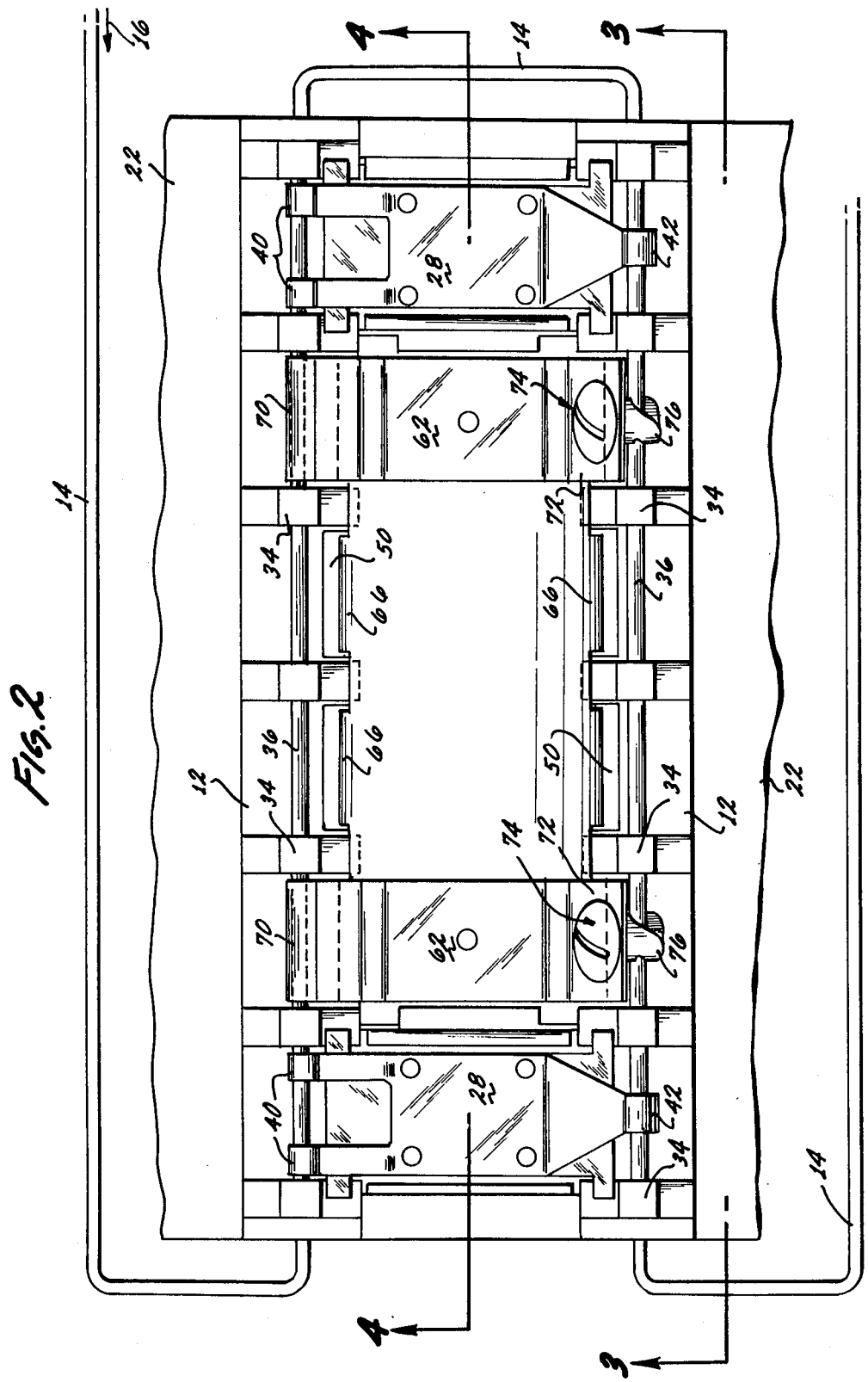
FIG. 2 is a plan view of one section of an island assembly such as shown in FIG. 1 in assembled relationship.
Figure 3:
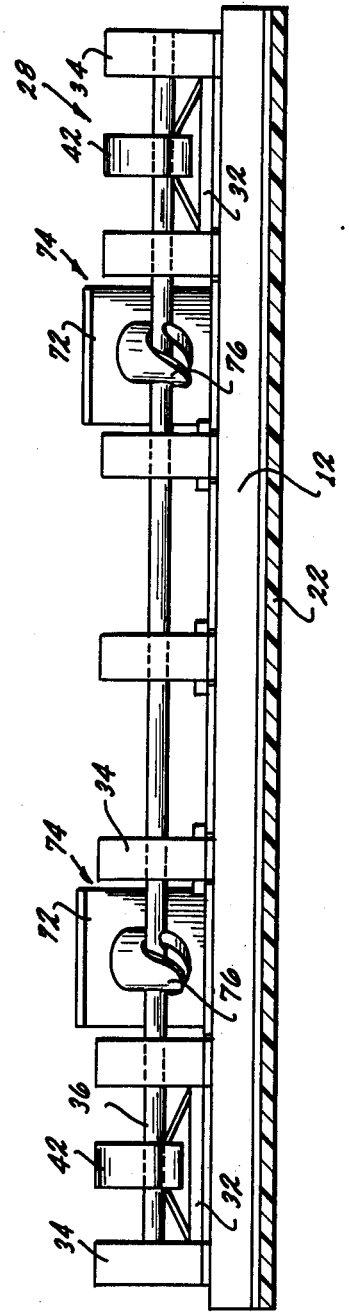
FIG. 3 is a cross-sectional view of the assembly taken along line 3—3 of FIG. 2 and looking in the direction of the arrows.

Referring first to FIGS. 1 & 2, there is shown an island assembly cooling frame 10 having a plurality of spaced apart sections 12 having continuous tubing 14 disposed therein in a serpentine fashion for the flow of coolant therethrough. A refrigeration-type evaporator system is connected to the inlet 16 and outlet 18 (FIG. 2) of the tubing 14 and includes a pump, heat exchanger and a means to blow air through the exchanger to reduce the temperature of the coolant returning from the frame.

Since any cooling system that will accomplish the heat transfer is satisfactory and well-known, no further description is deemed necessary herein.

Figure 4:
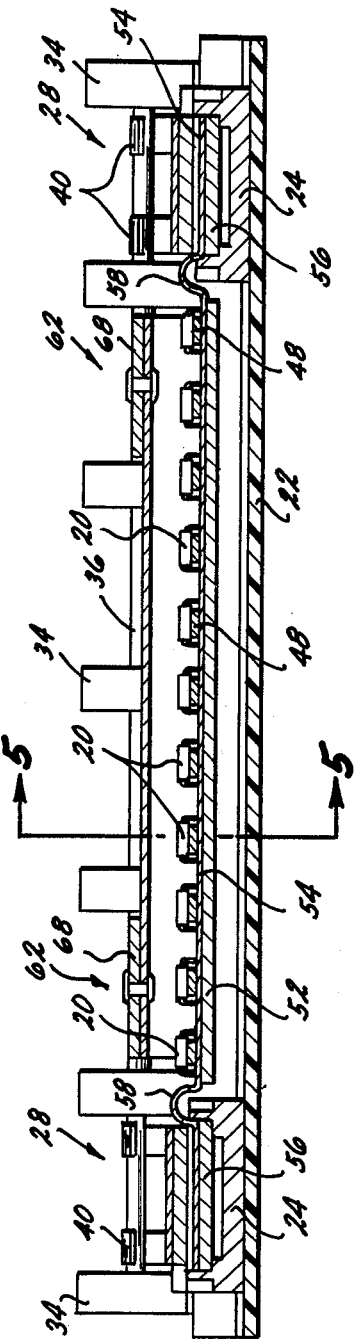
FIG. 4 is a cross-sectional view of taken along line 4—4 of FIG. 2 and looking in the direction of the arrows.

The purpose of the cooling frame and the circulating coolant is to maintain integrated circuit packages 20 more clearly shown mounted in other Figures, particularly FIG. 4, as dual-in-line type (DIP) when mounted in the cooling frame at a uniform temperature during operation.

In the embodiment shown, the DIP's 20 are mounted in rows side-by-side between two adjacent frame sections 12. The bottoms of the frame sections have a main interconnection medium 22 or printed circuit board attached thereto having suitable conductive leads formed thereon in the conventional manner. Conductive pads are also formed on the top surface of the interconnection medium which in turn may be connected to pins which protrude through the medium and which may be interconnected by various wiring means or with the printed wiring throughout.

The purpose of the conductive pads is to make an electrical contact with the terminal portions of main connectors 24 located at each end of the frame sections and which are fastened to the main interconnection medium 22 by any suitable means. Each connector 24 is provided with a pair of locating pins (not shown) situated on the underside of the connector to mate with suitable holes formed in the main interconnect medium and served to position the contact elements over the conductive pads aforementioned. The connector 24 comprises a body of insulated material and is fastened to the interconnect medium 20 by any suitable means such as by a screw threaded through the interconnect medium 20 and into the connector or is connected to the interconnect medium by the so-called solder tail connections as disclosed and claimed in the U.S. Pat. No. 3,999,826 of R. V. Hutchison and assigned to the same assignee as this invention.

The connectors 24 as disclosed herein are located at each end of the spaced apart frame sections and were originally designed to each receive an integrated circuit package placed in the connector as described and claimed in the aforementioned Braun et al patent a supra. In that patent, an integrated circuit package of a particular design was placed in this connector so that the leads on the package engaged the conductor leads 26 in the connector for electrical continuity. To insure this continuity, a hold down device, such as shown herein at 28, which comprises a spring-like member 30 secured by rivet-like attachments to a pressure plate 32 which bore against the package heat sink member. The hold down device 28 is positioned between adjacent spaced apart frame section 12 members of the cooling frame 10 by virtue of groups of elevated brackets 34 fasten to the frame and each group of brackets supporting a common rod 36 which passes therethrough. One end of the hold down spring-like member 30 is notched in at 38 and formed into a U-shaped configuration such that the extremities of the legs 40 of the U are wrapped around one rod 36 to prevent the hold down device from coming free while the opposite end of the member 30 has a single latch projection 42 configured to latch in opposition to the force of a spring of this member 30 with the opposite rod 36. It should be noted that the latch projection 42 is designed to contact the latter rod 36 and occupy the space formed by the notch 38 between a pair of legs 40 of the spring member in the next succeeding row of hold down devices.

Thus far described the cooling frame 10 and sections 12, the main interconnect medium 22, the connectors 24 and the hold down devices 28 are well-known and described and claimed in the aforementioned Braun et al patent. As aforesaid, the purpose of this invention is to utilize such existing equipment and to provide a means of mounting of conventional DIP packages in this existing equipment, without modification, to enable individual islands to interface with other equipment.

Again, turning to FIGS. 1 and 4, it can be seen that a plurality of DIP's 20 are mounted side-by-side to form a row between two of the connectors 24 on a relatively flat, relatively thin rectangular metallic carrier 44 which also forms a heat sink for the DIP's. This carrier is provided with a plurality of rectangular or elongated apertures 46 generally of the length of the DIP's to permit the DIP pins to extend therethrough and to permit the bodies of the DIP's to straddle, in thermal contact, DIP supporting means in the form of webs 48 formed by the aforesaid apertures. This carrier is also provided with a plurality of extensions or tabs 50 extending outwardly from the center of the carrier to engage the cooling frame sections 12 for the transfer of heat generated by the DIP's to the cooling frame. In the embodiment shown, there are four such extensions on each side of the carrier, each of a width to extend between adjacent brackets 34 and of a length to engage approximately one-half of the width of this section 12.

To connect the DIP's or other electronic devices, the pins of the DIP's which extend through the elongated heat sink apertures 46 are inserted into suitable holes in a second or cable interconnection medium or printed circuit board 52 of the size and shape generally commensurate with the carrier member and having suitable conductor lead lines printed thereon in the conventional manner to interconnect the individual DIP's to each other and to a ribbon type cable 54 above the carrier and this second printed circuit board, this ribbon type cable 54 extends outwardly beyond the ends of the printed circuit board 52 and is provided at each end with a cable connector means 56 in the form of a third printed circuit board having conductor pads formed thereon which are electrically connected to the cable and are arranged to complement the conductor leads 26 of the connectors 24. Thus, the DIP's are in communication with the main island interconnect medium 22 through the ribbon cable with the cable connector means 56 being inserted into engagement with the conductor leads 26 of the connectors. It should be noted that the printed circuit board 52 beneath the DIP carrier 44 is separated and spaced apart from the cable connector means 56 to permit the ribbon type cable to bend at 58 so as to extend over the edge of the main connector 24 when the cable connector means 56 are inserted in the connectors 24 which in accordance to this invention permits the use of the conventional connectors 24 without modification thus achieving one of the goals of this invention. It should be noted too, in this connection that the cable connector means 56 is provided with indexing notches 60 to match indexing pins 61 in the connectors 24. These latter pins are in the conventional connectors and were used to index the heat sinks of the packages heretofore and are now used to locate the cable connector means 56.

From the foregoing, it can be seen that plurality of DIP's are placed on a carrier heat sink 44 in thermal engagement therewith and the pins thereof are electrically connected, without modification to the cooling frame main interconnect medium 22 as well as in thermal engagement with the cooling frame 12 through the carrier. In practice, it should be evident, that the DIP's can be mounted on the carrier heat sink 44 and electrically connected to the cable interconnect medium 52 and ribbon cable 54 (the latter already having the cable connector boards 56 mounted thereon) to form a unit separate and apart from the frame 10 and can be inserted in the island as a unit. In the manufacture of this unit, care is taken that the bodies of the DIP are in direct contact with the heat sink carrier 44 and the connection of the pins to the cable interconnect medium 52 ensures this continued thermal contact during the operation of the DIP's in the island since the pins are soldered or otherwise mechanically fixed to the cable interconnect medium.

In order further to ensure maximum thermal conductivity between the DIP carrier 44 and the cooling frame 12, a clamping means 62 is also provided which pressurizes the tabs 50 of the carrier 44 against the frame sections 12. This clamping means 62 comprises an elongated concave, generally a cylindrical, metallic spring pressure plate 64, again compensurate in length and width to the DIP carrier heat sink 44 and provided with a plurality of in-turned lips 66, (four shown) to engage the four tabs 50 on the DIP carrier. On the side opposite the in-turned lips 66, there is provided a pair of spring-like members 68 secured, as by rivoting, to the plate 64. One end of the spring-like members 68 is configured into a U-shaped configuration 70 such that the ends are wrapped around one of the rods 36 in a manner similar to the extremities 40 of the spring-like members 30 of the hold down devices 28 while the other end of the members 68 are apertured and bent upwardly and outwardly as at 72 to form a tab so as to be spaced apart from the other rod 36 when the clamp is in closed position so as to accomodate an attaching device or clamp indicated in its entirety as 74. The attaching device 74 is provided with a notched member 76 which engages the other rod 36 when the clamping device is in its clamped position as more clearly shown in FIG. 5.

The attached device or clamp 74 rotates in the aperture in the tab 72 and, when placed over the rod 36, rotation by a screwdriver, or other suitable instrument, will move the tab 72 towards the rod thereby urging the pressure plate 64 downwardly and forcing the DIP carrier heat sink 44 into tight thermal contact with these sections 12. Since the clamps 74 are commerically available, no further description is deemed necessary herein.

What is claimed is:

1. A packaging system for electronic equipment comprising at least one island, including:
   a plurality of integrated circuit packages having leads thereon,
   an interconnection medium having first electrical conductors thereon,
   a cooling frame fastened to said interconnection medium configured such that a plurality of sections of thermally conductive material are situated in parallel spaced apart relationship across the surface of said interconnection medium,
   connector means having a plurality of electrical contacts and operatively connected in a predetermined relationship to said interconnection medium at opposite ends thereof and providing respective electrical paths between said integrated circuit packages and said interconnection medium first conductors,
   a heat sink carrier means disposed between said frame sections and in thermal conductive relationship therewith and having package supporting means thereon,
   second conductor means adjacent said heat sink carrier plate and extending into said connector means at each end of said interconnection medium,
   said packages being mounted on said heat sink carrier means in rows straddling package supporting means and electrically connected to said second conductor means,
   means for urging a portion of said second conductor means into said connector means so as to provide electrical contact with the electrical contacts therein.

2. The packaging system as claimed in claim 1 wherein said heat sink carrier means is a plate provided with extensions which engage said frame sections.

3. The packaging system as claimed in claim 2 further including clamping means for urging said extensions into thermal contact with said frame sections.

4. The packaging system as claimed in claim 3 wherein said clamping means includes means for engaging each extension.

5. The packaging system as claimed in claim 4 wherein said cooling frame incorporates continuous tubing connecting said frame sections and arranged in a serpentine path and adapted to transport cooling fluid therethrough for maintaining said integrated circuit packages at substantially uniform temperature.

6. The packaging system as claimed in claim 5 wherein said packages are dual-in-line packages and whose leads are pins extending through said heat sink carrier means and into said second conductor means.

7. The packaging system as claimed in claim 6 wherein said second conductor means is a ribbon type flexible cable.

8. The packaging system as claimed in claim 7 wherein a second interconnection medium is connected to said flexible cable and aligned with said heat sink carrier means for receiving the pins of said dual-in-line packages.

9. The packaging system as claimed in claim 8 wherein the ends of said flexible cable are provided with connector interconnection media each of which are inserted in said connector means to form the aforesaid electrical paths.

10. The packaging system as claimed in claim 9 wherein the flexible cable has a portion between said second interconnection medium and said connector interconnection media and said portion is free to flex to compensate for the height of the edges of the connector means.

11. In a packaging system including electronic equipment having a cooling frame and an interconnection medium with first conductors thereon fastened thereto such that a plurality of sections of thermally conductive material of said frame are situated in parallel spaced apart relationship across the surface of an interconnection medium, and further having main connector means operatively connected to said interconnection medium via said first conductors and providing electrical paths therebetween, the improvement comprising as a unitary structure,
   a heat sink carrier means having package supporting means thereon,
   a second conductor means adjacent said heat sink carrier means and extending into said main connector means at each end thereof, and
   a plurality of dual-in-line integrated circuit packages having pins and whose bodies contact said package supporting means and whose pins extend through said heat sink carrier means into said second conductor means and are electrically connected to said second conductor means so that as said unitary structure is positioned in said cooling frame, said heat sink carrier means engage said spaced apart sections and said second conductor means is positioned in said main connector means, thus heat generated by said packages is conducted away and said packages electrically interface with said interconnection medium.

* * * * *